United States Patent
Chen et al.

(10) Patent No.: US 6,368,941 B1
(45) Date of Patent: Apr. 9, 2002

(54) FABRICATION OF A SHALLOW TRENCH ISOLATION BY PLASMA OXIDATION

(75) Inventors: Tai-Ju Chen, Tai-Nan; Hua-Chou Tseng, Hsin-Chu, both of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/707,995

(22) Filed: Nov. 8, 2000

(51) Int. Cl.$^7$ ............................................... H01L 21/76
(52) U.S. Cl. ...................... 438/424; 438/425; 438/435; 257/510
(58) Field of Search ................................ 438/424, 425, 438/435; 257/510

(56) References Cited

U.S. PATENT DOCUMENTS

| | | | | |
|---|---|---|---|---|
| 5,258,332 A | * | 11/1993 | Horika et al. | 438/424 |
| 5,578,518 A | * | 11/1996 | Koike et al. | 438/424 |
| 5,712,185 A | * | 1/1998 | Tsai et al. | 438/424 |
| 5,837,612 A | * | 11/1998 | Ajuria et al. | 438/424 |
| 5,863,827 A | * | 1/1999 | Joyner | 438/425 |
| 5,880,004 A | * | 3/1999 | Ho | 438/421 |
| 6,090,684 A | * | 7/2000 | Ishitsuka et al. | 438/424 |
| 6,106,678 A | * | 8/2000 | Shufflebotham et al. | 204/192.32 |

FOREIGN PATENT DOCUMENTS

| | | | | |
|---|---|---|---|---|
| EP | 000423722 A2 | * | 4/1991 | H01L/21/76 |
| JP | 3-129854 | * | 6/1991 | H01L/21/76 |
| JP | 7-176604 | * | 7/1995 | H01L/21/76 |
| KR | 2001004681 | * | 1/2001 | H01L/21/31 |

OTHER PUBLICATIONS

Sorab K. Ghandi VLSI Fabrication Principles John Wiley and Sons 1994 p. 649.*

* cited by examiner

*Primary Examiner*—Charles Bowers
*Assistant Examiner*—David S Blum
(74) *Attorney, Agent, or Firm*—Winston Hsu

(57) ABSTRACT

The present invention provides a method of fabricating a STI on a wafer to eliminate the common occurrence of junction leakage in the prior art. The method begins by forming a patterned hard mask on a silicon substrate. The patterned hard mask is a laminated layer comprising a pad oxide and a silicon nitride layer, and exposes a portion of the surface of the silicon substrate. The exposed portion of the silicon substrate is then dry etched to form a trench in the silicon substrate having a <100> surface and a <111> surface. Next, a portion of the pad oxide is wet etched around the STI corners of the trench to expose a portion of the top surface of the silicon substrate surrounding the periphery of the trench. A microwave-excited Kr/O$_2$ plasma is used to oxidize both the interior surface of the trench and the exposed top surface of the silicon substrate located beneath the layer of silicon nitride surrounding the periphery of the trench at a temperature of 400° C. to form a silicon dioxide liner of uniform thickness on the STI <100> surfaces and <111> surface. Finally, an insulating material, such as HDP oxide, is deposited on the silicon substrate to fill in the trench followed by a chemical-mechanical polishing.

13 Claims, 3 Drawing Sheets

FABRICATION OF A SHALLOW TRENCH ISOLATION BY PLASMA OXIDATION

BACKGROUND OF THE INVENTION

1. Field of the Invention

The present invention relates to a STI method for semiconductor processes, and more particularly, to a method of STI fabrication on a semiconductor wafer with superior gap filling ability, increased integration density and reduced junction leakage effects.

2. Description of the Prior Art

In semiconductor front-end processes, a shallow trench isolation (STI) technique is commonly used to provide sufficient isolation between electrical devices on a wafer. A typical STI process involves the formation of shallow trenches surrounding an active island, referred to as an "active area", on the wafer. Then, an oxide layer or a liner is formed on the interior surface of the trenches by a thermal oxidation process followed by the filling in of the trenches with an insulating material to obtain electrical isolation effects. Due to an increased integration of the electrical devices fabricated on the wafer, the widths of the shallow trenches decrease leading to an increase in aspect ratio. The increase in the aspect ratio of trenches results in reduced gap filling ability and poor product reliability. Furthermore, the use of conventional thermal oxidation in the formation of a liner also hinders gap filling and increases junction leakage.

Please refer to FIG. 1 and FIG. 2. FIG. 1 and FIG. 2 are schematic cross-sectional diagrams of the fabrication of an isolating trench 14 on a semiconductor wafer 10 according to the prior art method. The figures are examples and not drawn to scale. As shown in FIG. 1, a patterned mask layer 25 with an opening 13 is first formed on a silicon substrate 12. The opening 13, formed by conventional lithography and etching processes, exposes a portion of the silicon substrate 12 and defines the location and pattern of a trench 14. Generally, the patterned mask layer 25 comprises a pad oxide layer 22, and a silicon nitride layer 24 laminated on the pad oxide layer 22. A conventional plasma dry etching process, such as a reactive ion etching (RIE), is then used to carve the silicon substrate not covered by the mask layer 25 to form a trench 14. The trench 14 has a depth H, a top width $W_1$, and a bottom width $W_2$. It is known that during the carving or etching of the silicon substrate 12, the silicon surface orientation gradually changes from a <111> sidewall surface 16 to a <100> bottom surface 18.

As shown in FIG. 2, due to damage of both the sidewall surface 16 and the bottom surface 18 during the RIE process, defects in the STI structure are produced. Thus, a thermal oxidation process, also known as a furnace oxidation process, is performed to oxidize the sidewall surface 16 and the bottom surface 18 at a temperature environment of 800° C. to 1000° C. to form a liner oxide layer 28 on the interior surface of the trench 14. Another objective of the thermal oxidation process is to round the corners of the sharp corner portions 19, located at the interface of the trench 14 and the horizontal surface of the silicon substrate 12, to release stress.

However, in a conventional thermal oxidation process, the growth rate, dielectric strength, interface trap density (Dit) and etc. of silicon oxide are strongly dependent on the surface orientation of silicon. Generally, the integrity of silicon oxide grown by thermal oxidation on the <100> bottom surface 18 is poorer than on the <111> sidewall surface 16. The difference in integrity leads to a significant decrease of the bottom width of the trench 14 from $W_2$ to $W_3$, as well as a significant change in aspect ratio, leading to a reduction in gap filling ability. For instance, in a conventional dry furnace oxidation, the silicon oxide thickness on the <111> sidewall surface 16 is approximately 400 to 500 angstroms (Å), while the silicon oxide thickness on the <100> bottom surface 18 is normally less than 300 Å. Also, in the conventional thermal oxidation process, the amount of corner-rounding of the corner portions 19 is not sufficient and results in high interface trap density in the conventional thermal liner oxide layer 28.

SUMMARY OF THE INVENTION

It is therefore a primary objective of the present invention to provide a method of fabricating an STI on a wafer with both superior gap filling and stress-releasing ability.

Another objective of the present invention is to provide a method of fabricating an STI on a wafer with superior gap filling ability, increased integration density and reduced junction leakage, by an oxidation process independent of Si surface orientation.

The present invention describes a method of fabricating an STI on a wafer using a plasma liner forming process that eliminates junction leakage commonly occurring in the prior art. The method begins by the formation of a patterned hard mask on a silicon substrate, preferably a P-doped single crystal silicon substrate. The patterned hard mask is a laminated layer comprising a pad oxide and a layer of silicon nitride and exposes a portion of the surface of the silicon substrate. The exposed portion of the silicon substrate is then dry etched to form a trench in the silicon substrate with both a <100> surface and a <111> surface. Next, a portion of the pad oxide is wet etched near the top corners of the trench to expose a portion of the top surface of the silicon substrate located beneath the silicon nitride layer surrounding the periphery of the trench. At a temperature of 400° C., a microwave-excited high-density $Kr/O_2$ plasma is induced to oxidize both the interior surface of the trench and the exposed top surface of the silicon substrate located beneath the silicon nitride layer surrounding the periphery of the trench beneath the layer of silicon nitride to form a silicon dioxide liner of uniform thickness on both the STI <100> surface and the <111> surface. The resulting conformal silicon dioxide liner displays superior corner-rounding effects and excellent integrity on both the <100> surface and <111> surface. Finally, an insulating material, such as HDP oxide, is deposited on the silicon substrate to fill in the trench followed by chemical-mechanical polishing.

In one preferred embodiment of the present invention, the thickness of the conformal silicon dioxide liner is less than 300 angstroms (Å). The microwave-excited high-density $Kr/O_2$ plasma is induced at a specific and enhanced electrical field strength. In an enhanced electrical field and microwave-excited high-density $Kr/O_2$ plasma environment, the interior surfaces of the trench, i.e. the <111> surface and <100> surface, and the corner portions of the silicon substrate (STI edges) are synchronously oxidized to form a first oxide liner having a first predetermined thickness and a second oxide liner having a second predetermined thickness, greater than the first predetermined thickness, respectively.

DETAILED DESCRIPTION OF THE PREFERRED EMBODIMENT

Figure 1:
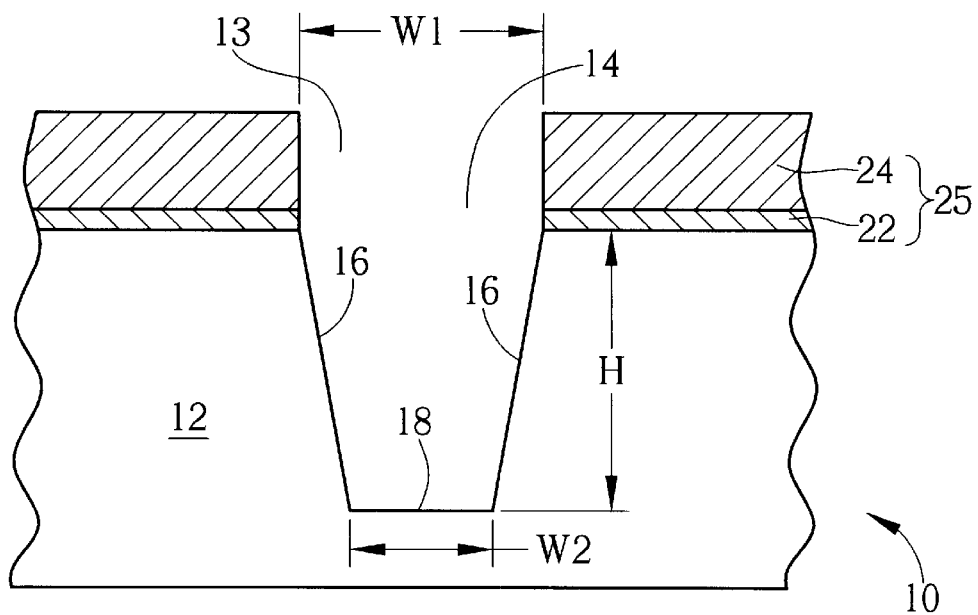
FIG. 1 and FIG. 2 are cross-sectional diagrams illustrating the processing steps for fabricating an STI according to the prior art.
Figure 2:
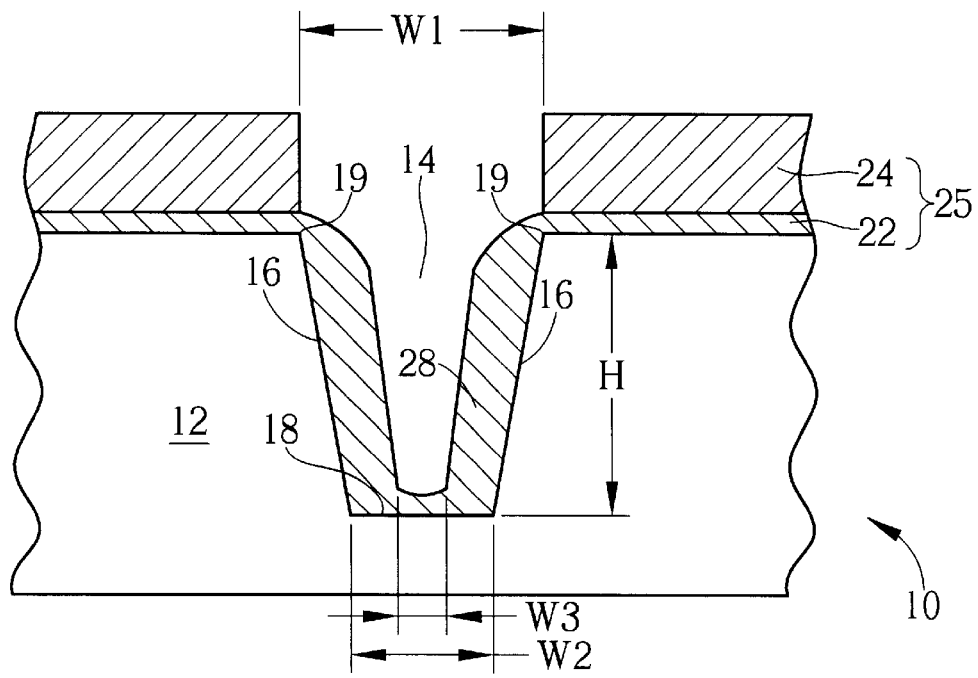
Figure 3:
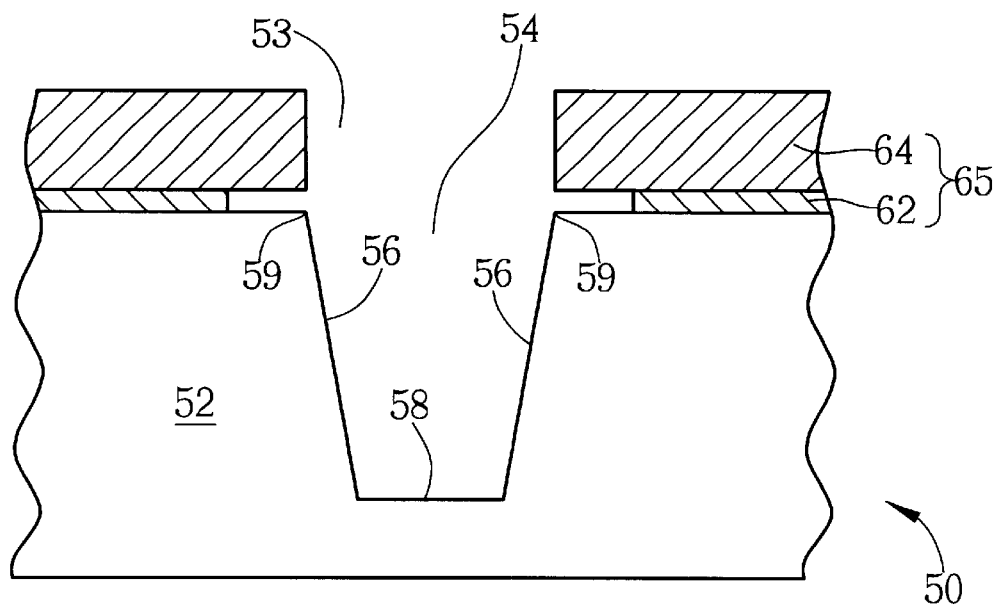
FIG. 3 to FIG. 5 depict a schematic cross-sectional view of the processing steps for fabricating an improved STI according to the present invention.
Figure 4:
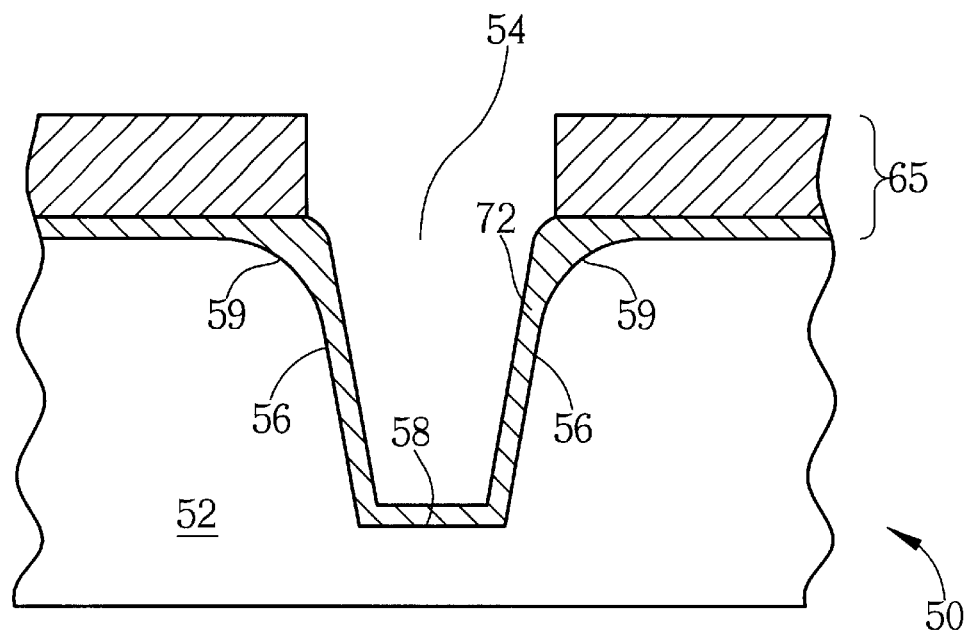
Figure 5:
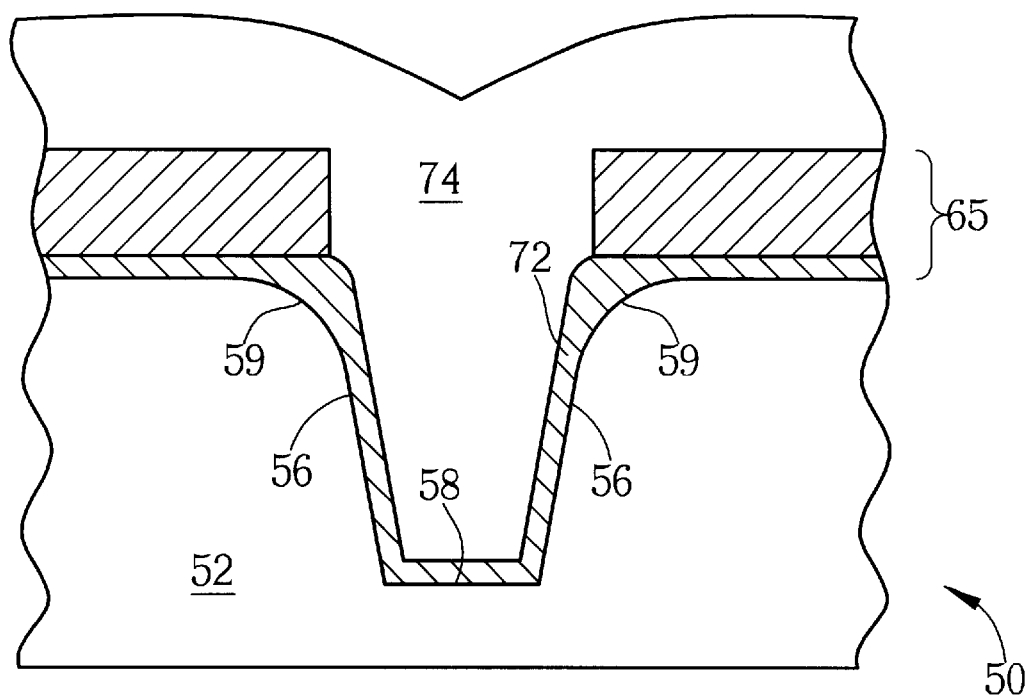

Please refer to FIG. 3 to FIG. 5. FIG. 3 to FIG. 5 show the cross-sectional views of the processing steps of one preferred embodiment of the present invention for fabricating an improved STI on a semiconductor wafer 50. The figures are examples and not drawn to scale. As shown in FIG. 3, a pad oxide layer 62 with a thickness of approximately 100 to 200 Å is first formed on a silicon substrate 52, preferably a P-doped single crystal silicon substrate. In one embodiment, the silicon substrate 52 is a silicon-on-insulator (SOI) substrate. Then, a silicon nitride layer 64 is deposited on the pad oxide layer 62 by a conventional LPCVD process. Both the pad oxide layer 62 and the silicon nitride layer 64 form a hard mask 65 in the subsequent etching process. By conventional lithography and etching processes, the hard mask 65 is defined and patterned and forms an opening 53 to expose a portion of the silicon substrate 52. Next, a reactive ion etching (RIE) process is performed to etch the exposed surface of the silicon substrate 52 in the opening 53 to form a trench 54 in the region not covered by the hard mask 65. During the RIE process, silicon surface orientation gradually changes from a <111> sidewall surface 56 to a <100> bottom surface Thereafter, the semiconductor wafer 50 is dipped into a buffer oxide etcher (BOE) solution for an approximate time period of several seconds to a couple of minutes, to wet etch a portion of the pad oxide layer 62 around the STI edge or STI corner 59, to expose a portion of the top surface of the silicon substrate 52 located beneath the silicon nitride layer 64 surrounding the periphery of the trench. Wet etching of the pad oxide layer 62 is typically performed in a wet chemical station.

As shown in FIG. 4, the semiconductor wafer 50 is then subjected to a microwave-excited high-density $Kr/O_2$ plasma oxidation process to form a uniform silicon dioxide liner 72 on the <111> sidewall surface 56, the <100> bottom surface 58 and the STI corner 59. The resulting conformal silicon dioxide liner 72 has a greater thickness at the STI corner 59 to reduce sharp corner stress. In the preferred embodiment of the present invention, the thickness of the conformal silicon dioxide liner 72 is normally less than 300 Å, preferably 80 to 250 Å on both the <111> sidewall surface 56 and the <100> bottom surface 58, and 200 to 300 Å on the STI corner 59. In the preferred embodiment of the present invention, the $Kr/O_2$ plasma oxidation process uses krypton as a carrier gas and is performed in a traditional vacuum chamber with an evacuated pressure of 1 Torr, at a temperature of 400° C., and at a plasma density of approximately $10^{12}$ $cm^{-3}$. The energy level of ion bombardment is set at less than 20 eV with an electron temperature below 1.3 eV. The advantages of the microwave-excited high-density $Kr/O_2$ plasma oxidation process are: (1) a low temperature (400° C. or lower) oxidation process; (2) low bombardment energy; (3) high plasma density; (4) low electron temperature. However, the present invention is not limited to the above-mentioned process parameters. Various sets of parameters can be used to achieve the purpose of the invention with effective results. For example, the carrier gas can be nitrogen or other inert gases. Also, the mixture ratio of oxygen and krypton can be set at 3% at a pressure of 1 Torr.

Finally, as shown in FIG. 5, a high-density plasma CVD process (HDPCVD) is used to fill in the trench 54 with a layer of insulating material 74 followed by a 1000° C. densifying process to densify the insulating material 74.

Since the oxidation rate of the microwave-excited high-density $Kr/O_2$ plasma is independent of Si surface orientation with an ultra-thin thickness of up to 15 nm, the conformal silicon dioxide liner 72 is formed on the interior surface of the trench 54 without a significant decrease in the original top or bottom width of the trench 54 to thereby improve both gap filling ability and integration density. Furthermore, the charged ions created by the microwave-excited high-density $Kr/O_2$ plasma are accelerated in the presence of the applied electrical field so that the sharp STI corners 59, subjected to a stronger field are oxidized at a higher oxidation rate than the interior surface of the trench 54.

In comparison with the prior art, the present invention of fabricating an STI possesses the following advantages: (1) effective corner-rounding ; (2) improved gap filling ability; (3) increased dielectric strength of the line layer; (4) lower junction leakage; and (5) lower interface trap density.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of fabricating an STI, the method comprising:

providing a silicon substrate;

for lifting a patterned hardmask on the silicon substrate, wherein the patterned hard mask is a laminated layer comprising a pad oxide and a silicon nitride layer, and exposes a portion of the surface of the silicon substrate;

etching the exposed surface of the silicon substrate not covered by the hardmask to form a trench in the silicon substrate;

wet etching a portion of the pad oxide layer around the STI edge to expose a portion of the top surface of the silicon substrate located beneath the silicon nitride layer surrounding the periphery of the trench;

synchronously oxidizing both the interior surface of the trench and the exposed portion of the top surface of the silicon substrate surrounding the periphery of the trench by a high-density oxygen plasma oxidation process at both a low temperature and a low pressure, to form a liner oxide layer having a first thickness on the interior surface of the trench and a thicker oxide layer having a second thickness, greater than the first thickness, on the STI edge; and filling in the trench by a dielectric layer;

wherein an electrical field is applied to the oxygen plasma so that ions created by the plasma has a low ion bombardment energy; wherein the high-density oxygen plasma oxidation process is independent of the surface orientation of silicon.

2. The method of claim 1 wherein the portion of the pad oxide layer surrounding the STI edge is wet etched using a buffer oxide etcher (BOE) solution.

3. The method of claim 1 wherein the exposed surface of the silicon substrate not covered by the hard mask is etched by a reactive ion etching (RIE) process.

4. The method of claim 1 wherein the high-density oxygen plasma is a microwave-excited high-density $Kr/O_2$ plasma.

5. The method of claim 1 wherein the first thickness is less than 300 Å.

6. The method of claim 1 wherein the low temperature is 400° C. and the low pressure is 1 Torr.

7. The method of claim 1 wherein the electrical field is less than 20 ev.

8. The method of claim 1 wherein following the filling in of the trench with the dielectric layer, the method further comprises:
- performing a 1000° C. thermal process to densify the dielectric layer; and
- performing a CMP process to planarize the dielectric layer.

9. A method of fabricating an STI, the method comprising:
- providing a silicon substrate;
- sequentially forming a pad oxide layer and a stop layer on the silicon substrate;
- performing a lithography and an etching process to define and pattern a trench pattern in the pad oxide layer and the stop layer;
- performing an RIE process to etch the silicon substrate not covered by the pad oxide layer and the stop layer to form a trench in the silicon substrate, the trench having two <111> oriented silicon sidewalls and one <100> oriented bottom;
- wet etching a portion of the pad oxide layer around the STI edge to expose a portion of the top surface of the silicon substrate located beneath the silicon nitride layer surrounding the periphery of the trench;
- synchronously oxidizing both the two <111> oriented silicon sidewalls and the <100> oriented bottom of the trench and the exposed portion of the top surface of the silicon substrate surrounding the periphery of the trench using a high-density $Kr/O_2$ plasma oxidation process, at both a low temperature and a low pressure to form a liner oxide layer having a first thickness on both the <111> oriented silicon sidewalls and the <100> oriented bottom of the trench, and a thicker oxide layer having a second thickness, greater than the first thickness, on the STI edge; and
- filling in the trench with a dielectric layer;
- wherein the oxidation rates on both the <111> oriented silicon sidewalls and the <100> oriented bottom of the trench are the same during the high-density $Kr/O_2$ plasma oxidation process, while the oxidation rate at the STI edge is greater than the oxidation rate on the interior surface of the trench.

10. The method of claim 9 wherein the high-density $Kr/O_2$ plasma is a microwave-excited high-density $Kr/O_2$ plasma.

11. The method of claim 9 wherein the first thickness is less than 300 Å.

12. The method of claim 9 wherein the low temperature is 400° C. and the low pressure is 1 Torr.

13. The method of claim 9 wherein following the filling in of the trench with the dielectric layer, the method further comprises:
- performing a 1000° C. thermal process to densify the dielectric layer; and
- performing a CMP process to planarize the dielectric layer.

* * * * *